(12) United States Patent
Yamamoto et al.

(10) Patent No.: US 7,661,454 B2
(45) Date of Patent: Feb. 16, 2010

(54) ADHESIVE TAPE JOINING APPARATUS

(75) Inventors: Masayuki Yamamoto, Ibaraki (JP); Naoki Ishii, Kameyama (JP)

(73) Assignee: Nitto Denko Corporation, Osaka (JP)

( * ) Notice: Subject to any disclaimer, the term of this patent is extended or adjusted under 35 U.S.C. 154(b) by 177 days.

(21) Appl. No.: 12/030,062

(22) Filed: Feb. 12, 2008

(65) Prior Publication Data

US 2008/0202692 A1 Aug. 28, 2008

(30) Foreign Application Priority Data

Feb. 22, 2007 (JP) ............................. 2007-042115

(51) Int. Cl.
*B32B 37/00* (2006.01)
(52) U.S. Cl. .................. 156/361; 156/494; 156/522; 156/542; 156/556
(58) Field of Classification Search ............... 156/361, 156/368, 378, 494, 510, 522, 538, 539, 540, 156/541, 542, 556
See application file for complete search history.

(56) References Cited

U.S. PATENT DOCUMENTS 5,961,768 A * 10/1999 Tsujimoto .................. 156/285
6,080,263 A * 6/2000 Saito et al. .................. 156/253
6,698,488 B2 * 3/2004 Ishinoda .................... 156/496
7,438,631 B2 * 10/2008 Nagamoto et al. ............ 451/59

FOREIGN PATENT DOCUMENTS

JP 2005-123653 A 5/2005
JP 2005-150177 A 6/2005

* cited by examiner

*Primary Examiner*—James Sells
(74) *Attorney, Agent, or Firm*—Cheng Law Group, PLLC

(57) ABSTRACT

An apparatus of this invention includes: a workpiece holding mechanism that holds a ring frame and a wafer; a tape supplying device that supplies a continuous dicing tape or a continuous carrier tape to which a precut dicing tape is joined, to a joining position; a joining unit that joins the continuous dicing tape or the precut dicing tape separated from the carrier tape, to the ring frame and the semiconductor wafer; a tape cutting mechanism that cuts the dicing tape joined to the ring frame along a contour of the ring frame; and a residual tape collecting section that takes up and collects a residual tape after the cutting.

10 Claims, 16 Drawing Sheets

ADHESIVE TAPE JOINING APPARATUS

BACKGROUND OF THE INVENTION (1) Field of the Invention

The present invention relates to an apparatus that joins an adhesive tape for support to a bottom surface of a ring frame and a bottom surface of a semiconductor wafer mounted on a center of the ring frame to integrate the semiconductor wafer with the ring frame through the adhesive tape.

(2) Description of the Related Art

Conventionally, there have been utilized the following two types of adhesive tape joining apparatuses. JP-A 2005-150177 discloses an apparatus having a first configuration, for example.

More specifically, a strip-shaped adhesive tape is joined to a bottom surface of a ring frame and a bottom surface of a semiconductor wafer. Then, the adhesive tape is cut along a circular contour of the ring frame.

Moreover, JP-A 2005-123653 discloses an apparatus having a second configuration.

More specifically, an adhesive tape that has been cut into a circular shape previously is separated from a carrier tape, and then is joined to a bottom surface of a ring frame and a bottom surface of a semiconductor wafer.

Herein, such conventional adhesive tape joining apparatuses have the following problems.

In the precut adhesive tape joining apparatus having the second configuration, an extra length of the tape for avoiding division between a portion to be cut and a residual portion adjoining to the portion to be cut becomes unnecessary unlike the case of using the strip-shaped adhesive tape cut in a state where a tension is applied thereto. Accordingly, this apparatus has merits that the number of adhesive tapes obtained from one roll can be increased and an amount of a residual tape to be discarded can be reduced.

However, this apparatus fails to join an adhesive tape to a ring frame while applying a tension to the adhesive tape. Accordingly, this apparatus has problems that the adhesive tape becomes wrinkled and air bubbles are generated at a joining interface.

The strip-shaped adhesive tape joining apparatus having the first configuration can join an adhesive tape to a ring frame while applying a tension to the adhesive tape. Such an advantage ensures high joining accuracy without occurrence of wrinkles and the like. However, this apparatus must cut the adhesive tape while applying the tension to the adhesive tape and, consequently, requires a sufficient space between positions to be cut. Accordingly, this apparatus has problems that the number of adhesive tapes obtained from one roll is small and an amount of a residual tape to be discarded becomes larger, in comparison with the case of using a precut tape.

In a case where such adhesive tapes different in shape from each other are joined to a ring frame, the apparatuses must be selectively used in accordance with the shape of the adhesive tape to be used, and must be prepared independently. Such a disadvantage results in high installation costs and a wide installation space.

SUMMARY OF THE INVENTION

A principal object of the present invention is to provide an adhesive tape joining apparatus capable of using a strip-shaped adhesive tape and a precut adhesive tape as appropriate.

In order to achieve this object, the present invention adopts the following configuration.

An apparatus for joining an adhesive tape for support to a bottom surface of a ring frame and a bottom surface of a semiconductor wafer mounted on a center of the ring frame to integrate the semiconductor wafer with the ring frame, the apparatus comprising:

a workpiece holding mechanism that holds each of a ring frame and a semiconductor wafer in a predetermined position;

a tape supplying device that switches between loading of a strip-shaped adhesive tape and loading of a strip-shaped carrier tape by which a precut adhesive tape cut previously in correspondence with a size of the ring frame is held, and supplies the adhesive tape loaded thereinto toward a bottom surface of the ring frame held by the workpiece holding mechanism;

a tension mechanism that applies a tension to the supplied strip-shaped adhesive tape in a width direction;

a joining unit that includes a joining roller for rolling on a non-adhesion surface of the strip-shaped adhesive tape with the tension being applied thereto by the tension mechanism and a non-adhesion surface of the precut adhesive tape separated from the carrier tape folded back by a separating member while pressing these non-adhesion surfaces, and joins the adhesive tape to the ring frame and the semiconductor wafer each held by the workpiece holding mechanism;

a tape cutting mechanism that cuts the joined strip-shaped adhesive tape along a contour of the ring frame; and a residual tape collecting section that takes up and collects a residual tape of the cut strip-shaped adhesive tape.

With this apparatus according to the present invention, the strip-shaped adhesive tape or the precut adhesive tape can be joined to the ring frame and the semiconductor wafer with the use of the common joining unit irrespective of the shape of the adhesive tape. Accordingly, different types of adhesive tapes can be joined by one apparatus, leading to reduction in installation costs and an installation space.

Preferably, this apparatus is configured as follows.

For example, the workpiece holding mechanism includes a frame holding device that holds the ring frame, a wafer holding device that holds the semiconductor wafer, and a movable base that allows the frame holding device and the wafer holding device to move upward/downward.

With this configuration, the ring frame and the semiconductor wafer held at positions each spaced away from a joining position in the joining mechanism can be almost concurrently set at the joining position. That is, this apparatus can be facilitated in structure and reduced in size in comparison with the case of setting the ring frame and the semiconductor wafer at the joining position separately.

Preferably, this apparatus further comprises a driving device that allows the wafer holding device to move upward/downward such that the semiconductor wafer held by the wafer holding device moves upward/downward independently of the ring frame held by the frame holding device.

With this configuration, the vertical movement of the frame holding device and that of the workpiece holding device can be controlled as follows.

For example, the driving device is controlled such that the semiconductor wafer held by the workpiece holding device is stopped at a position where the semiconductor wafer protrudes from the adhesive tape joining surface of the ring frame.

In this case, preferably, the pressing operation by the joining roller is controlled upon joining of the adhesive tape such that the adhesive tape joining surface of the semiconductor wafer is flush with the adhesive tape joining surface of the ring frame.

Alternatively, the driving device is controlled such that the semiconductor wafer held by the workpiece holding device is located on standby at a position rearward with respect to the adhesive tape joining surface of the ring frame, the adhesive tape is joined to the ring frame by a joining roller, the semiconductor wafer is moved to the adhesive tape joining position and the adhesive tape is joined to the semiconductor wafer by a joining roller.

With this configuration, the bottom surface of the ring frame is made flush with the bottom surface of the semiconductor wafer, so that the adhesive tape can be joined to the ring frame and the semiconductor wafer concurrently.

Moreover, the adhesive tape is joined to the ring frame in a state where the semiconductor wafer retreats rearward with respect to the ring frame. Thereafter, the semiconductor wafer is moved to the joining action position, and the adhesive tape is joined to the semiconductor wafer. Accordingly, the adhesive tape can be joined to the ring frame and the semiconductor wafer with certainty.

Herein, the joining roller for joining the adhesive tape to the ring frame may be provided in a first joining unit, and the joining roller for joining the adhesive tape to the semiconductor wafer may be provided in a second joining unit.

Preferably, the strip-shaped adhesive tape is provided with a separator, and this apparatus further comprises a common separator collecting section that takes up and collects one of the separator separated from the strip-shaped adhesive tape and the carrier tape from which the precut adhesive tape is separated.

With this configuration, only a single take-up shaft is required, which is effective at facilitation of the structure and miniaturization of the apparatus.

Moreover, this apparatus may further comprise a common tape supplying section that feeds and supplies a tape from one of a roll of an adhesive tape with a separator and a roll of a carrier tape by which a precut adhesive tape is held.

With this configuration, only a single feed shaft is required, which is effective at facilitation of the structure and miniaturization of the apparatus.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Hereinafter, description will be given of one embodiment of the present invention with reference to the drawings.

Figure 1:
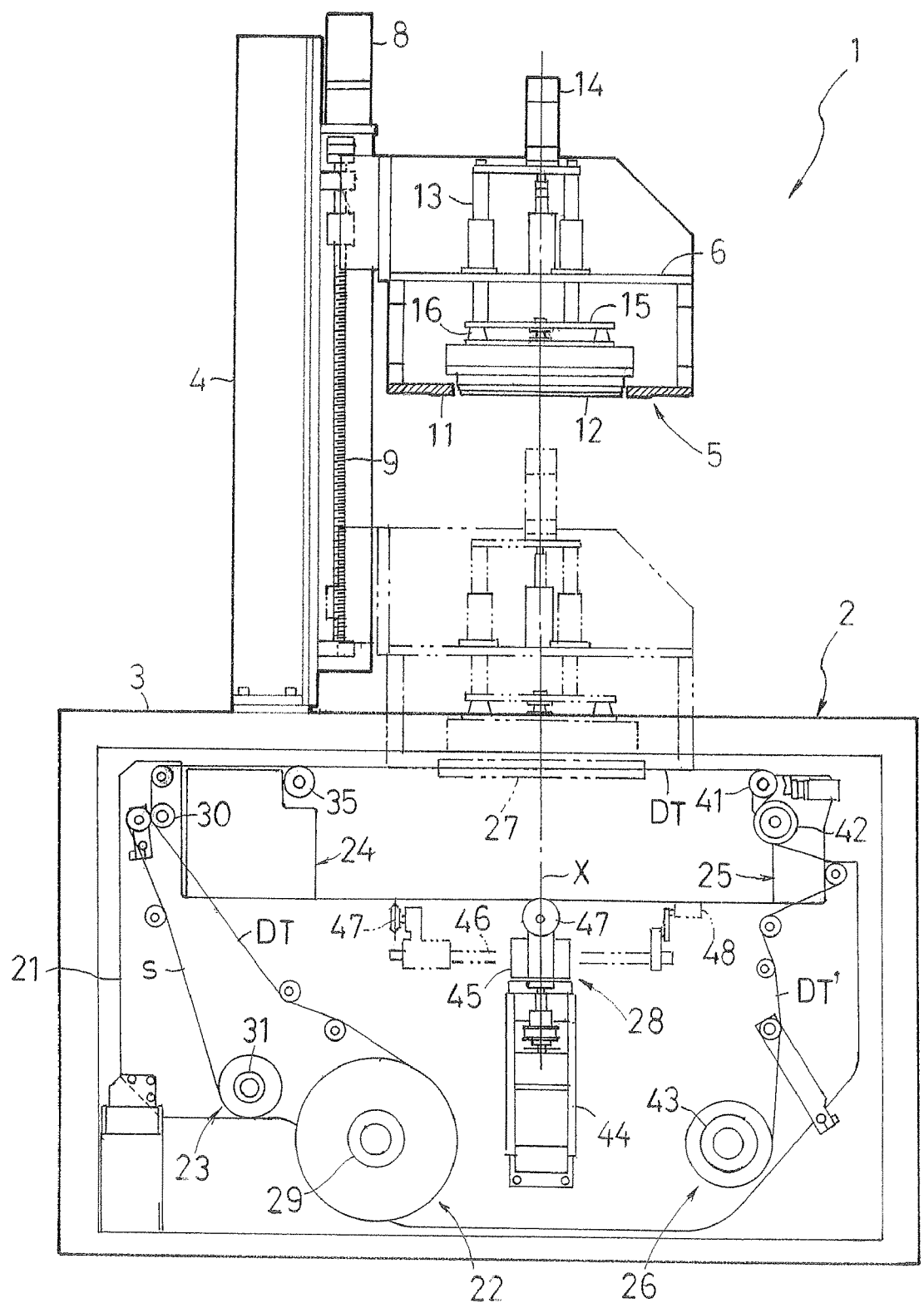
FIG. 1 is a side view illustrating a general configuration of an adhesive tape joining apparatus.

FIG. 1 is a side view illustrating an adhesive tape joining apparatus according to one embodiment of the present invention.

The adhesive tape joining apparatus 1 according to this embodiment includes a floor-mounted tape joining mechanism 2, and a workpiece holding mechanism 5 equipped through a strut frame 4 provided upright from a base frame 3 of the tape joining mechanism 2. The workpiece holding mechanism 5 is installed on a movable base 6 attached to the strut frame 4 so as to move upward/downward along the strut frame 4.

Figure 2:
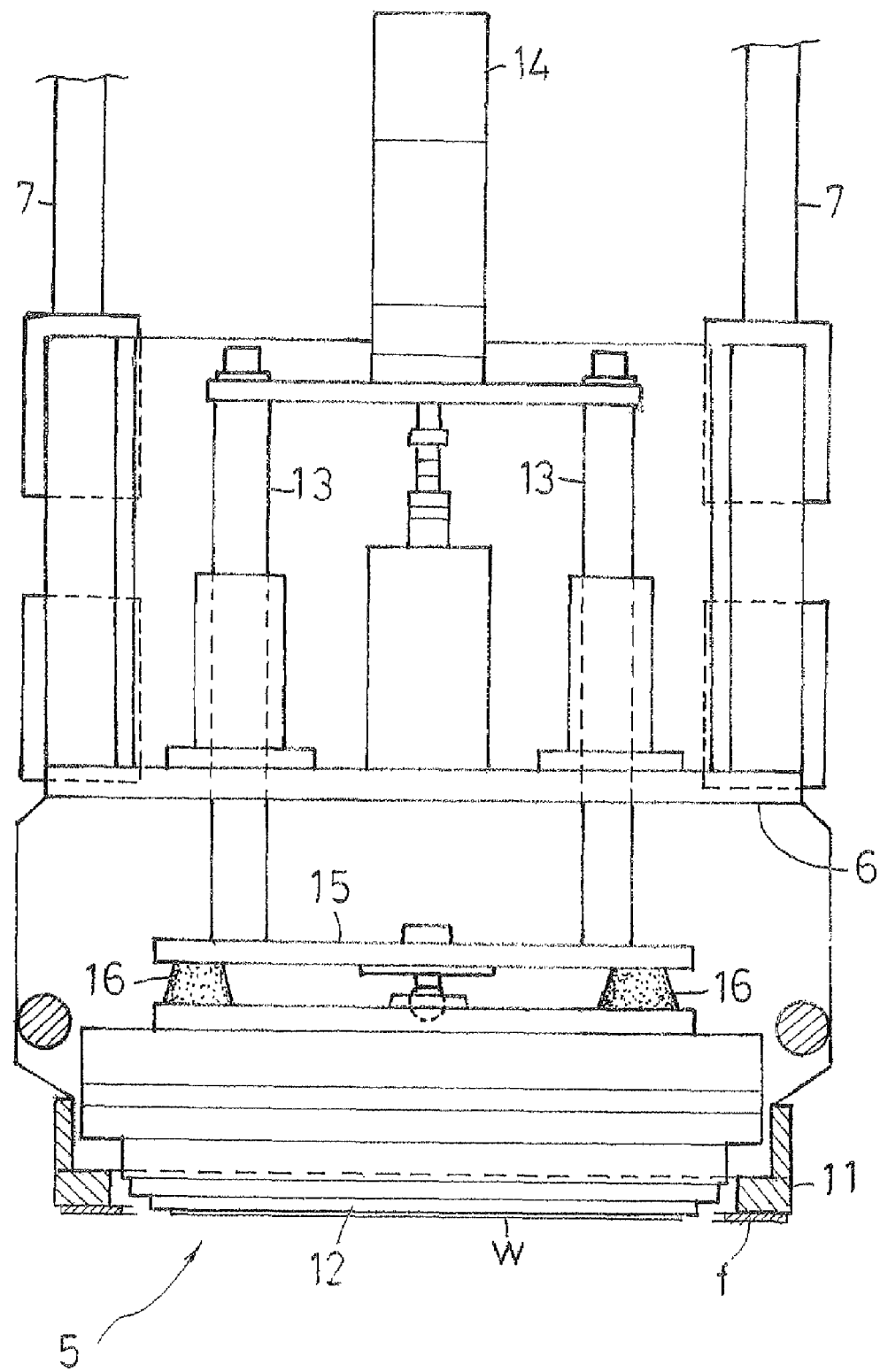
FIG. 2 is a front view illustrating a workpiece holding mechanism.
Figure 3:
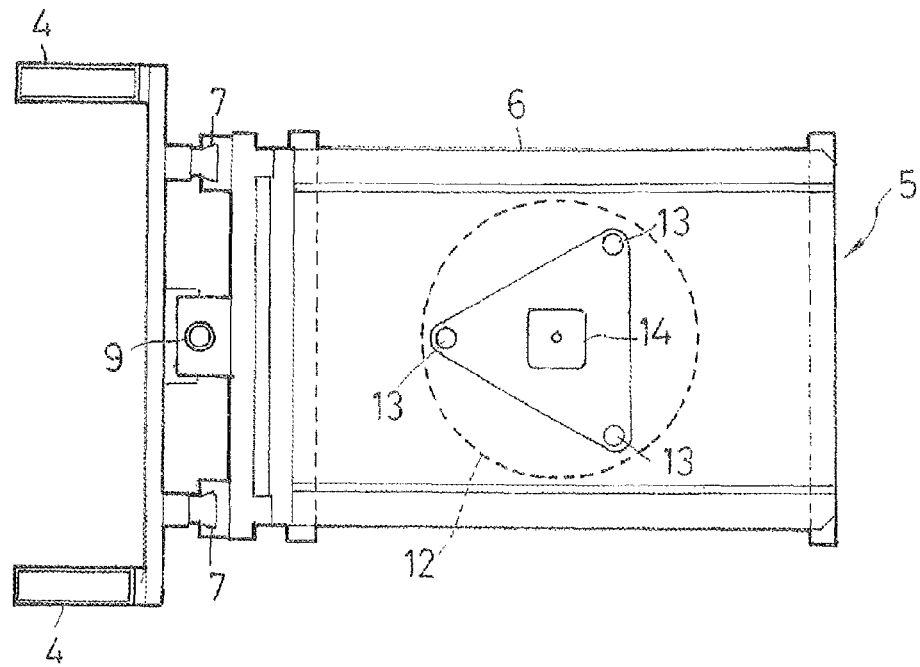
FIG. 3 is a plan view illustrating the workpiece holding mechanism.

As illustrated in FIGS. 1 to 3, the movable base 6 is supported by a pair of vertical rails 7 provided at the strut frame 4, and moves upward/downward by screw-feed of a screw shaft 9 rotated by a motor 8 in a forward/backward direction.

As illustrated in FIG. 2, at a bottom end of the movable base 6, a hollow-shaped frame holding frame 11 is provided for sucking a first workpiece, that is, a ring frame f from above to hold the ring frame f in a horizontal position. Moreover, at a center of the frame holding frame 11, a chuck table 12 is provided for sucking a second workpiece, that is, a semiconductor wafer w subjected to a back grinding process (hereinafter, simply referred to as a "wafer w") from above to hold the wafer w in a horizontal position. It is to be noted that the frame holding frame 11 is equivalent to a frame holding device according to the present invention, and the chuck table 12 is equivalent to a wafer holding device according to the present invention.

The movable base 6 is supported by three guide shafts 13 so as to move upward/downward, and is provided with a lifting bracket 15 actuated by an air cylinder 14. Moreover, the chuck table 12 is supported by the lifting bracket 15 through a buffering member 16 made of rubber. The lifting bracket 15 moves upward/downward, so that the wafer w held by the chuck table 12 can move upward/downward independently of the ring frame f.

As illustrated in FIG. 1, an upright plate-shaped support frame 21 is fixedly provided inside the base frame 3. The support frame 21 is equipped with a tape supplying section 22, a separator collecting section 23, a joining unit 24, a separating unit 25 and a residual tape collecting section 26. Moreover, a pair of tension mechanisms 27 are provided at an upper side of the base frame 3. Further, a tape cutting mechanism 28 is provided at a center of the base frame 3.

Figure 17:
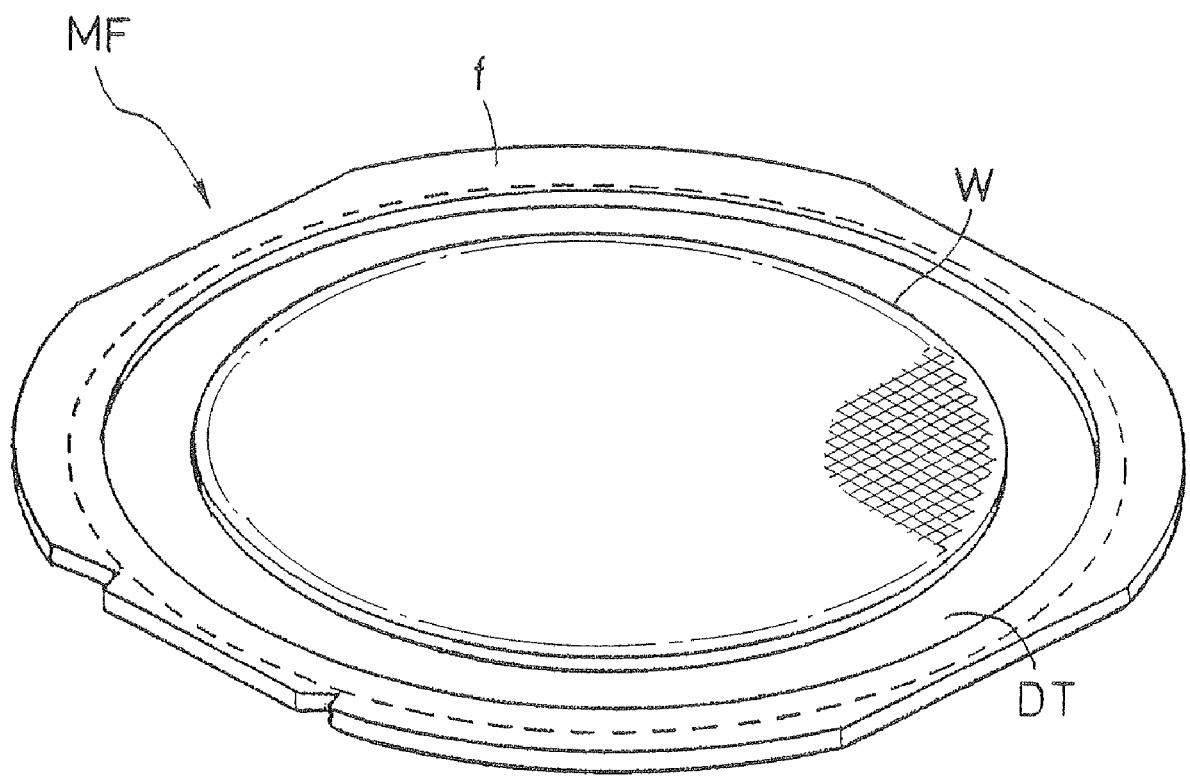
FIG. 17 is a perspective view illustrating amount frame.

The tape supplying section 22 has a feed shaft 29 around which a strip-shaped dicing tape DT with a separator can be wound in a form of a roll. As illustrated by a dashed line in FIG. 10 or 17, alternatively, a carrier tape CT can be wound in a form of a roll around the feed shaft 29. Herein, the carrier tape CT holds precut dicing tapes dt each of which is previously cut into a circular shape in accordance with a size of the ring frame f at a predetermined pitch. It is to be noted that the dicing tape DT is equivalent to a strip-shaped adhesive tape according to the present invention, and the precut dicing tape dt is equivalent to a precut adhesive tape according to the present invention.

It is assumed herein that the dicing tape DT is wound around the feed shaft 29. As illustrated in FIG. 1, the dicing tape DT with the separator is fed from the tape supplying section 22, and then is guided to a pair of pinch rollers 30 disposed at an upper side of the support frame 21. Herein, the separator s is separated from the dicing tape DT, and then is guided downward while being inverted. On the other hand, the dicing tape DT is separated from the separator s, so that an adhesion surface directed upward is bared. Then, the dicing tape DT is pulled out horizontally and is guided to the separating unit 25.

Figure 10:
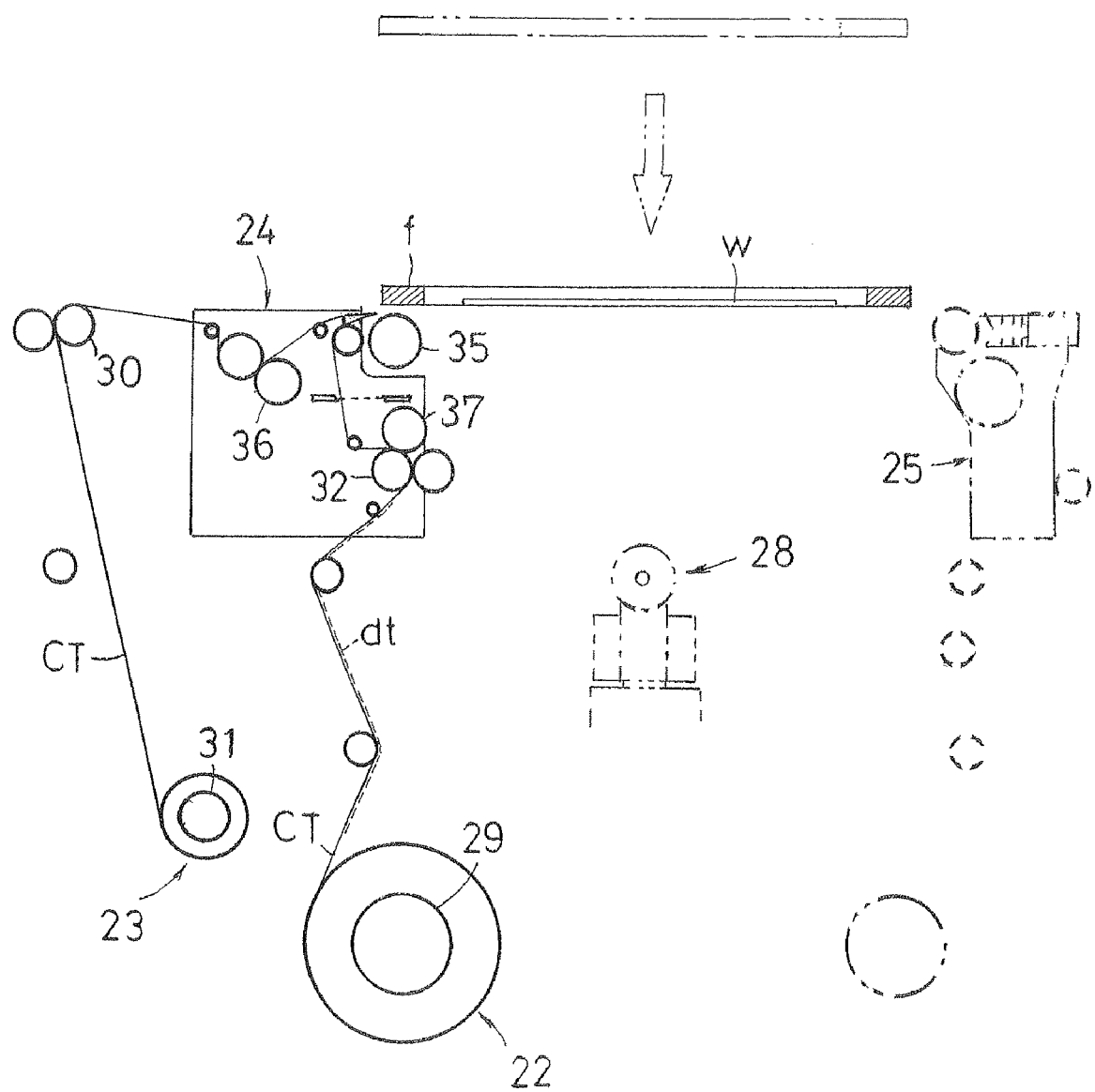
FIGS. 10 to 13 each illustrate a step of joining a precut dicing tape.

It is assumed herein that the carrier tape CT is wound around the feed shaft 29. As illustrated in FIG. 10, the carrier tape CT is fed from the tape supplying section 22, and then in guided to the pair of pinch rollers 30 via the joining unit 24 as will be described later.

The separator collecting section 23 is provided with a take-up shaft 31 to take up and collect the separator s which is separated from the dicing tape DT and then is guided downward by the pair of pinch rollers 30 while being inverted or the carrier tape CT which is guided downward by the pair of pinch rollers 30 while being inverted.

Figure 4A:
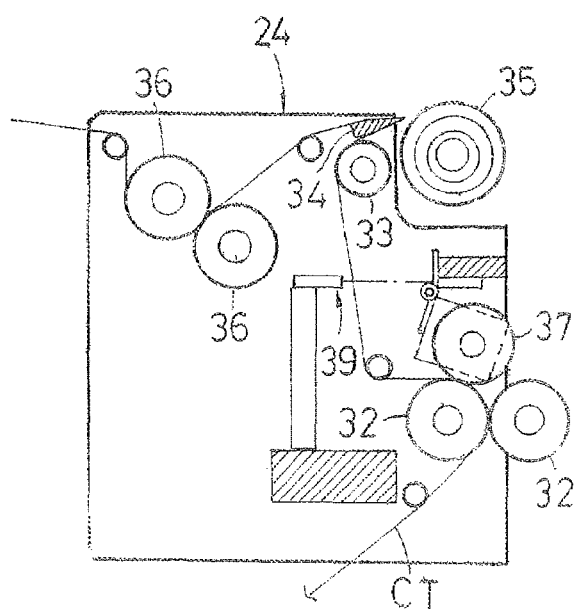
FIG. 4A is a side view illustrating a joining unit in a state where a carrier tape is loaded.
Figure 4B:
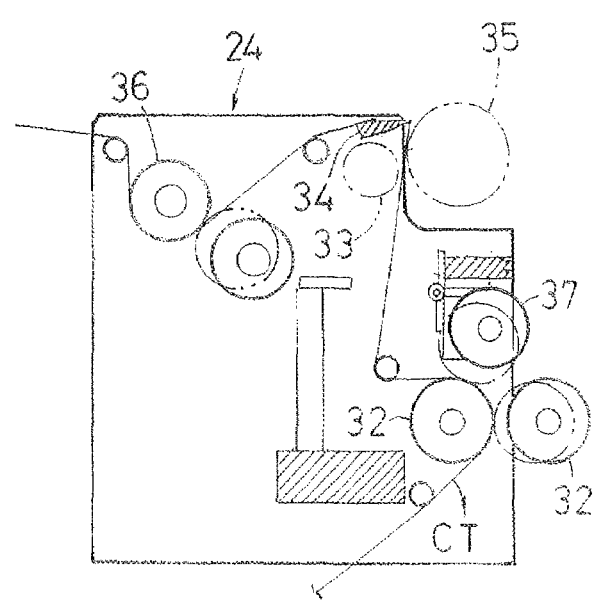
FIG. 4B is a side view showing the joining unit at the time when the carrier tape is loaded.

The joining unit 24 can reciprocate horizontally by a screw-feed type or belt type driving device (not illustrated). As illustrated in FIGS. 4A and 4B, for example, the joining unit 24 includes a pair of pinch rollers 32 for tape reception that receive the carrier tape CT, a guide roller 33, a separating member 34 formed into an edged thin plate shape, a joining roller 35, a pair of pinch rollers 36 for tape feed that feed the carrier tape CT, and the like.

It is assumed herein that the dicing tape DT is used. As illustrated in FIG. 1, the dicing tape DT is separated from the separator s by the pair of pinch rollers 30, and then is guided horizontally while being folded back. Thereafter, the dicing tape DT is guided to the separating unit 25 while coming into contact with the joining roller 35.

Figure 14A:
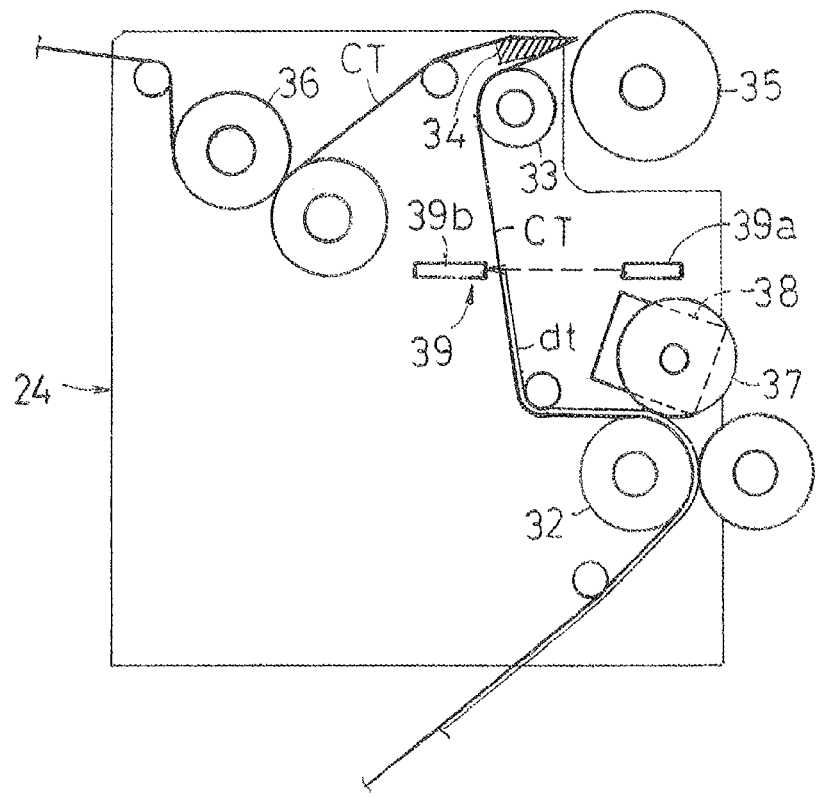
FIG. 14A is a side view illustrating the joining unit having the precut dicing tape loaded thereinto in a state where a leading end of the precut dicing tape is detected.
Figure 14B:
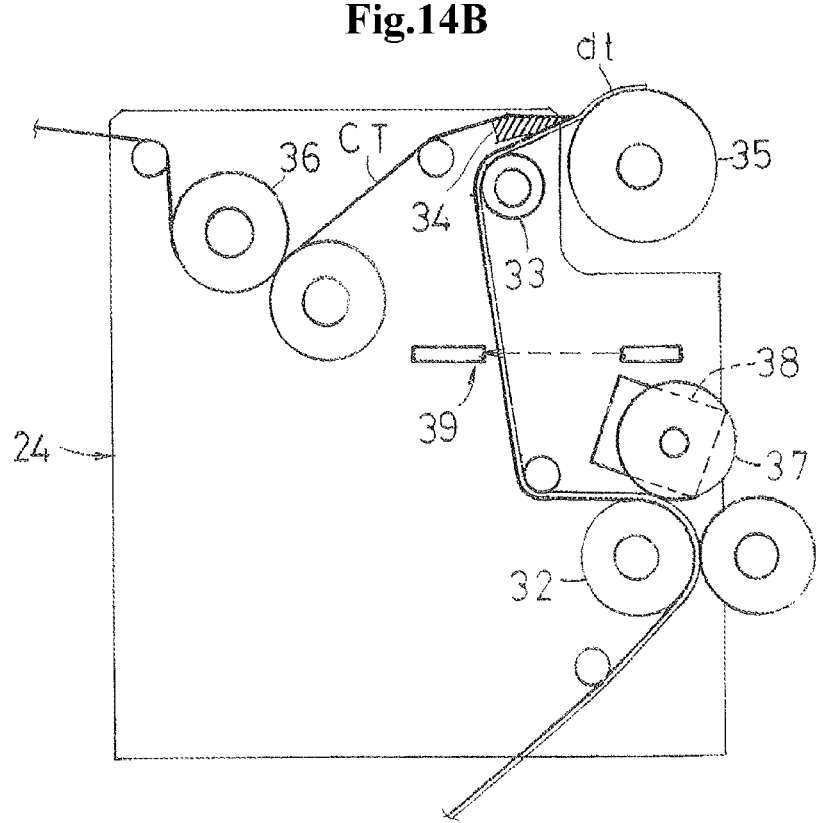
FIG. 14B is a side view illustrating the joining unit having the precut dicing tape loaded thereinto in a state where the precut dicing tape is set initially.

It is assumed herein that the precut dicing tape dt is used. As illustrated in FIGS. 14A and 14B, the carrier tape CT supplied to the joining unit 24 passes the pair of pinch rollers 32 for tape reception and the guide roller 33, and then is folded back by the separating member 34. Thereafter, the carrier tape CT passes the pair of pinch rollers 36 for tape feed, and then is guided to the pair of pinch rollers 30. When the carrier tape CT is folded back by a tip end edge of the separating member 34, a leading end of the precut dicing tape dt is separated from the carrier tape CT. This separated leading end approaches a joining position of the ring frame f and, almost concurrently, a non-adhesion surface of the precut dicing tape dt is pressed by the joining roller 35.

Above one of the pinch rollers 32 for tape reception around which the carrier tape CT is wound, a detection roller 37 is rotated while being pressed against the surface of the traveling carrier tape CT, and a rotary encoder 38 operates in accordance with the rotation of the detection roller 37. Herein, a moving amount of the carrier tape CT is detected based on detection information from the rotary encoder 38.

Moreover, a light projector 39a and a light receiver 39b are disposed near a tape traveling path between the pair of pinch rollers 32 for tape reception and the guide roller 33 to form a translucent type optical sensor 39. Herein, a position of the leading end of the precut dicing tape dt held by the carrier tape CT is detected from reduction in amount of light received by the light receiver 39b.

Figure 5:
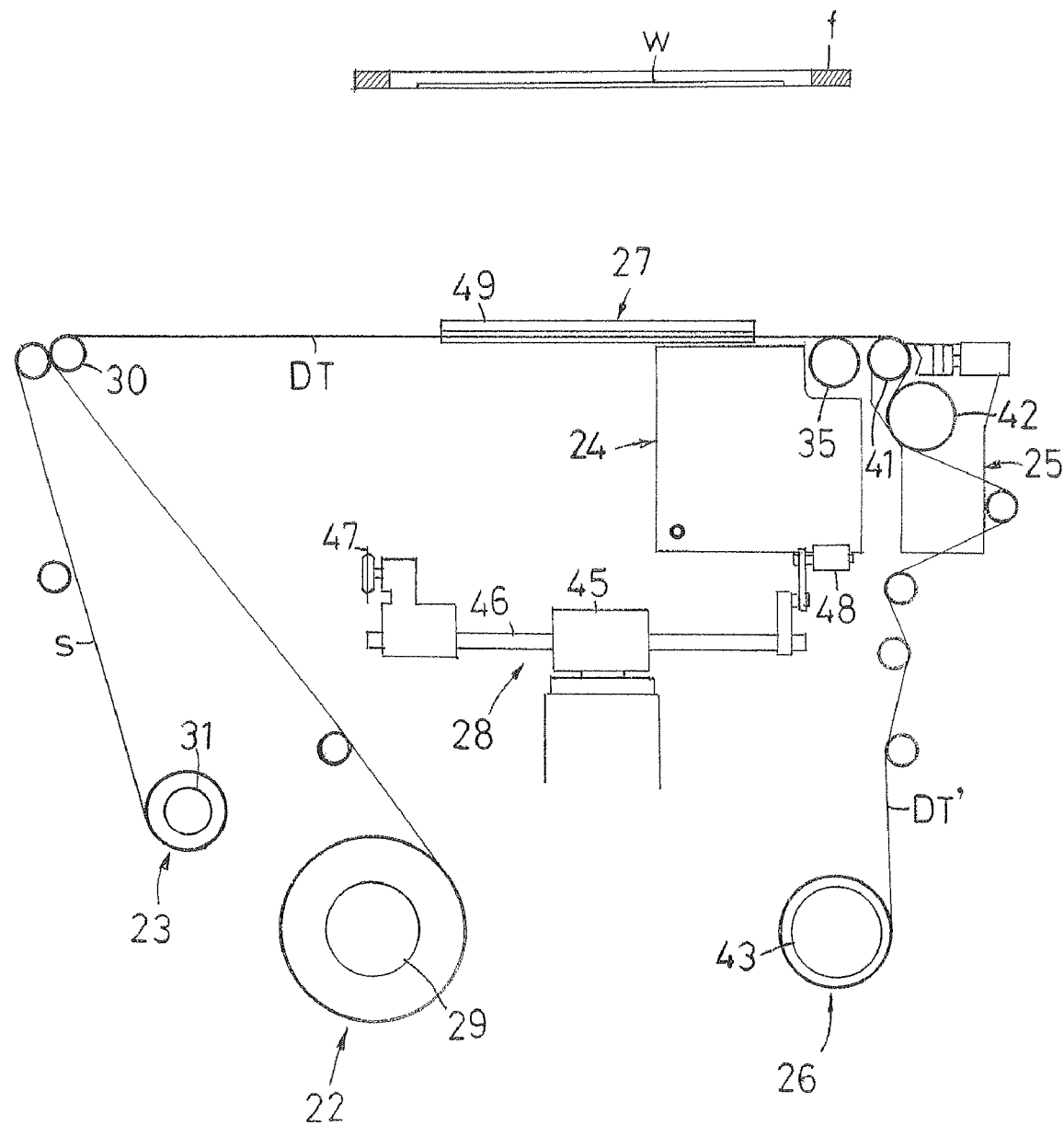
FIGS. 5 to 9 each illustrate a step of joining a strip-shaped dicing tape.

The separating unit 25 can reciprocate horizontally by a screw-feed type driving device (not illustrated). As illustrated in FIG. 5, further, a separation roller 41 and a guide roller 42 are provided for guiding the dicing tape DT fed horizontally by the joining unit 24.

The residual tape collecting section 26 is provided with a take-up shaft 43 to take up and collect a dicing tape (a residual tape) DT', that has been subjected to processing, from the separating unit 25.

As illustrated in FIG. 1, the tape cutting mechanism 28 is disposed on a center line X of the workpiece holding mechanism 5, and is moved upward/downward by an air cylinder 44. In the tape cutting mechanism 28, a support arm 46 horizontally extends from a base 45 that pivots about the center line X. The support arm 46 has an end provided with a disc-shaped cutter blade 47. At a position opposite to the cutter blade 47 with the center line X being interposed therebetween, an idling roller 48 is disposed to roll along a bottom surface of a workpiece.

The pair of tension mechanisms 27 are disposed at left and right upper ends of the base frame 3 so as to be opposed to each other with the dicing tape traveling path being interposed therebetween. As illustrated in FIG. 5, the pair of tension mechanisms 27 include clamping members 49 each actuated by air. The clamping members 49 hold left and right end sides of the dicing tape DT, which is set between the pair of pinch rollers 30 and the separating unit 25, from above and below, and slide outward so as to be spaced away from each other, respectively. Thus, an appropriate tension is applied to the dicing tape DT in a width direction.

The adhesive tape joining apparatus 1 according to this embodiment is configured as described above. Next, description will be given of a procedure to join the strip-shaped dicing tape DT or the precut dicing tape dt to the workpieces (the ring frame f and the wafer w).

FIGS. 5 to 9 each illustrate a case of joining the strip-shaped dicing tape DT.

(1) As illustrated in FIG. 5, in a joining start state, the workpiece holding mechanism 5 is located at an upward standby position. The ring frame f and the wafer w are supplied to the workpiece holding mechanism 5 with the use of a robot arm or the like. In the workpiece holding mechanism 5, the ring frame f and the wafer w are suction-held at predetermined positions, respectively. Herein, a bottom surface of the wafer w slightly protrudes downward from a bottom surface of the ring frame f.

In the tape joining mechanism 2, each of the joining unit 24 and the separating unit 25 is located at a standby position (rightward in the figure). The dicing tape DT with the separator fed from the tape supplying section 22 is set between the pair of pinch rollers 30 and the separation roller 41 with the separator s being separated therefrom. The pair of tension mechanisms 27 hold the left and right end sides of the set dicing tape DT; thus, an appropriate tension is applied to the dicing tape DT in the width direction.

(2) Next, the workpiece holding mechanism 5 moves downward to the joining position, so that the bottom surface of the ring frame f and the bottom surface of the wafer w are closely opposed to the upward adhesion surface of the dicing tape DT.

Figure 6:
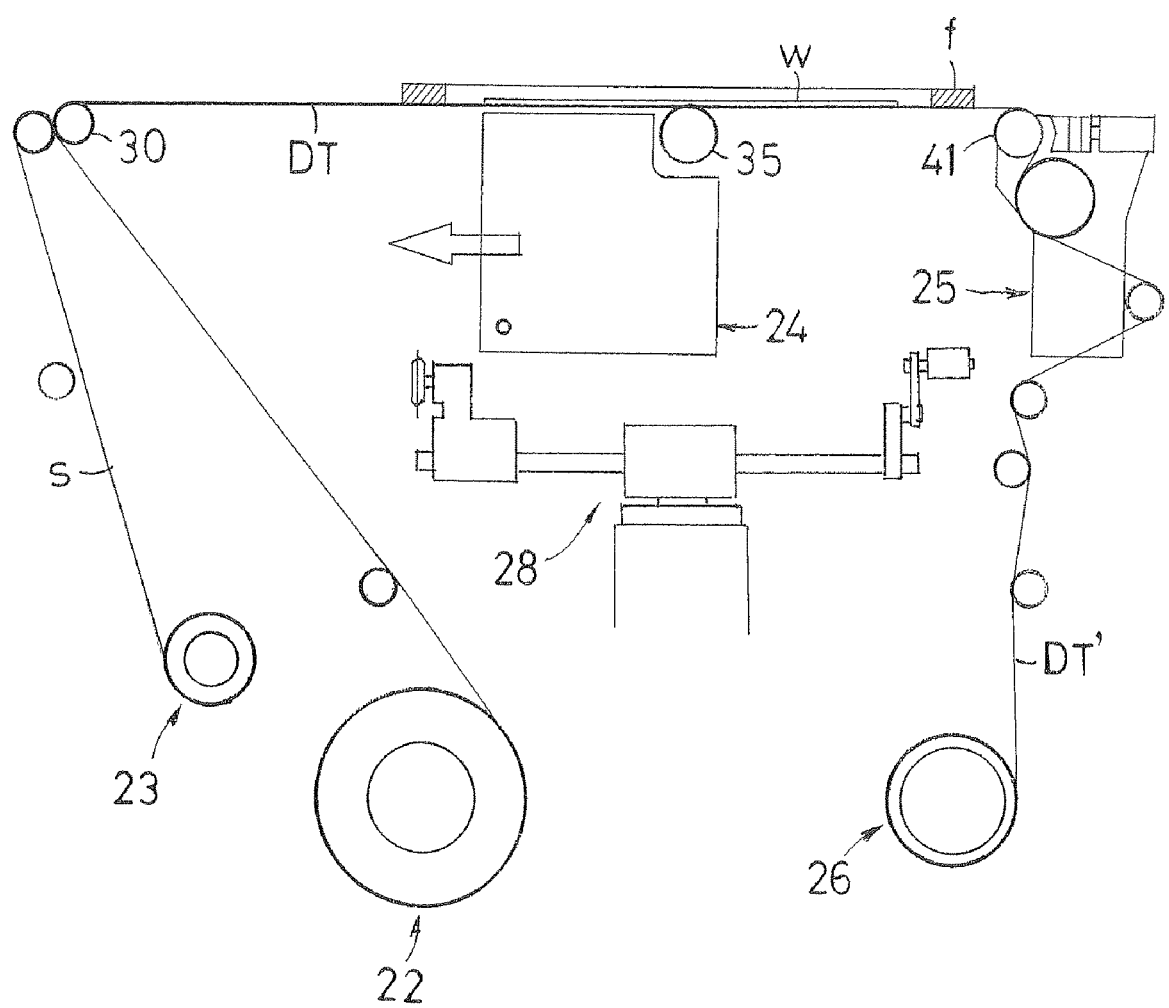

(3) As illustrated in FIG. 6, next, the joining unit 24 moves forward (leftward in the figure). Herein, the joining roller 35 pushes up the dicing tape DT, so that the dicing tape DT is joined to the bottom surface of the ring frame f and the bottom surface of the wafer w. In this case, the chuck table 12 holds the wafer w and is elastically supported through the buffering member 16. Accordingly, when the wafer w protruding downward from the ring frame f is pressed by the joining roller 35, the buffering member 16 becomes deformed elastically. By this elastic deformation, the bottom surface of the wafer w moves upward so as to be flush with the bottom surface of the ring frame f. Thus, the dicing tape DT is pressed against the entire bottom surface of the wafer w with certainty.

Figure 7:
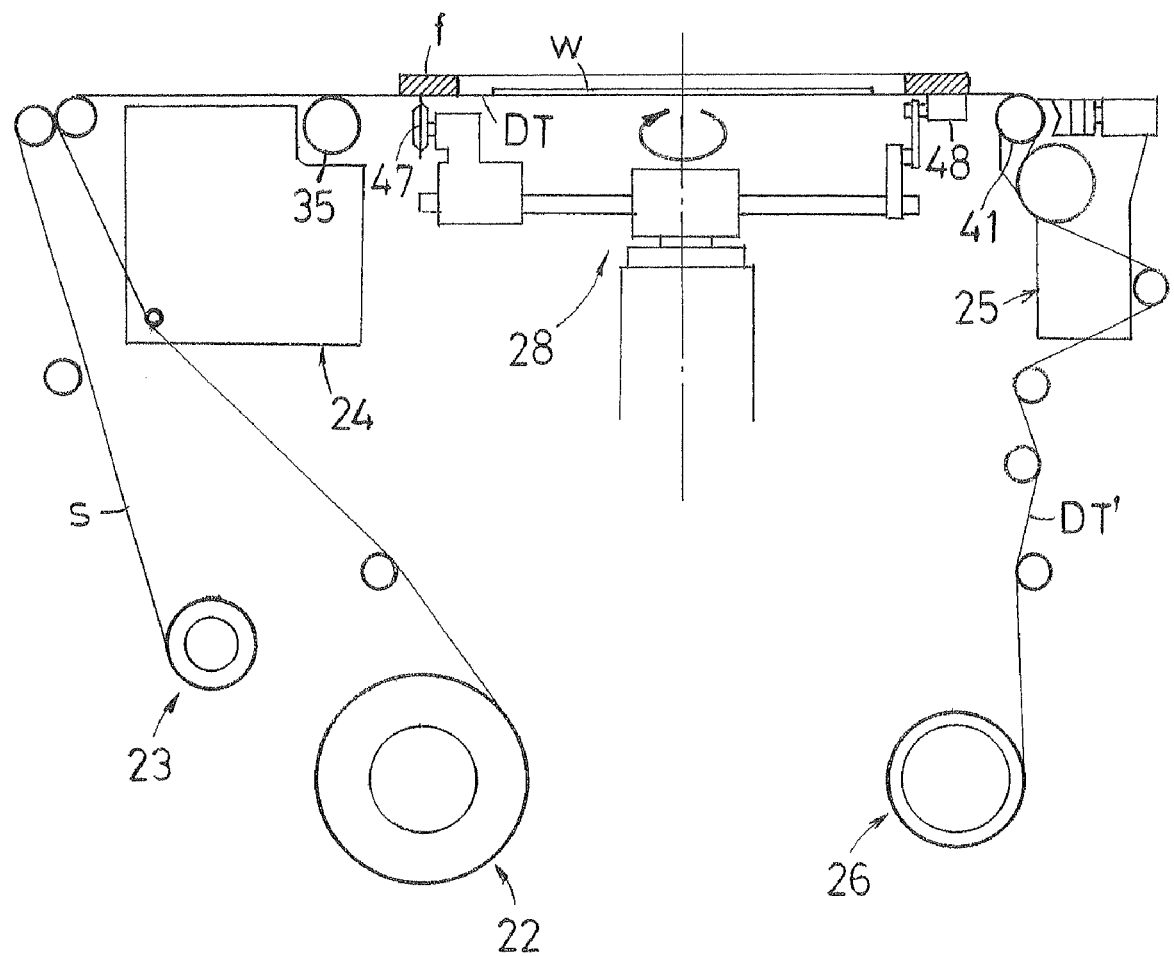

(4) As illustrated in FIG. 7, the joining unit 24 moves forward and reaches a terminal position; thus, the tape joining operation is completed. Thereafter, the pair of tension mechanisms 27 release the two ends of the dicing tape. Then, the tape cutting mechanism 28 moves upward to a cutting action position, and starts to rotate. Herein, the cutter blade 47 rotates and travels to cut the dicing tape DT joined to the bottom surface of the ring frame f at a predetermined diameter within a range of a ring width of the ring frame f. In correspondence with the rotation and travel of the cutter blade, the idling roller 48 rolls on the cut portion of the dicing tape DT. This prevents the dicing tape from floating.

Figure 8:
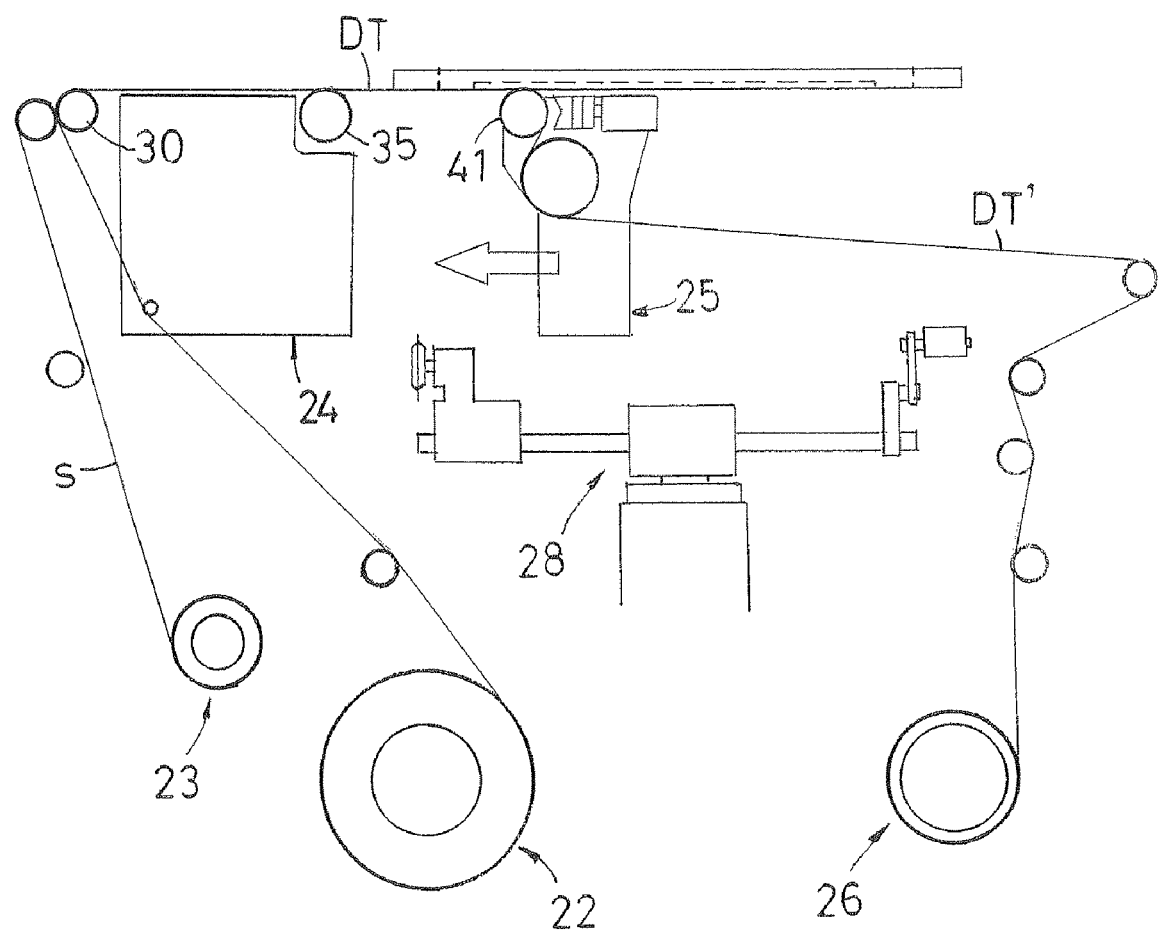

(5) After completion of the tape cutting operation, the tape cutting mechanism 28 moves downward to a standby position. As illustrated in FIG. 8, thereafter, the separating unit 25 moves forward (leftward in the figure) to separate the residual tape DT' of the dicing tape DT, that has been cut along the circular contour of the ring frame f, from the ring frame f. In synchronization with this separation, the take-up shaft 43 of the residual tape collecting section 26 takes up the residual tape DT'.

Figure 9:
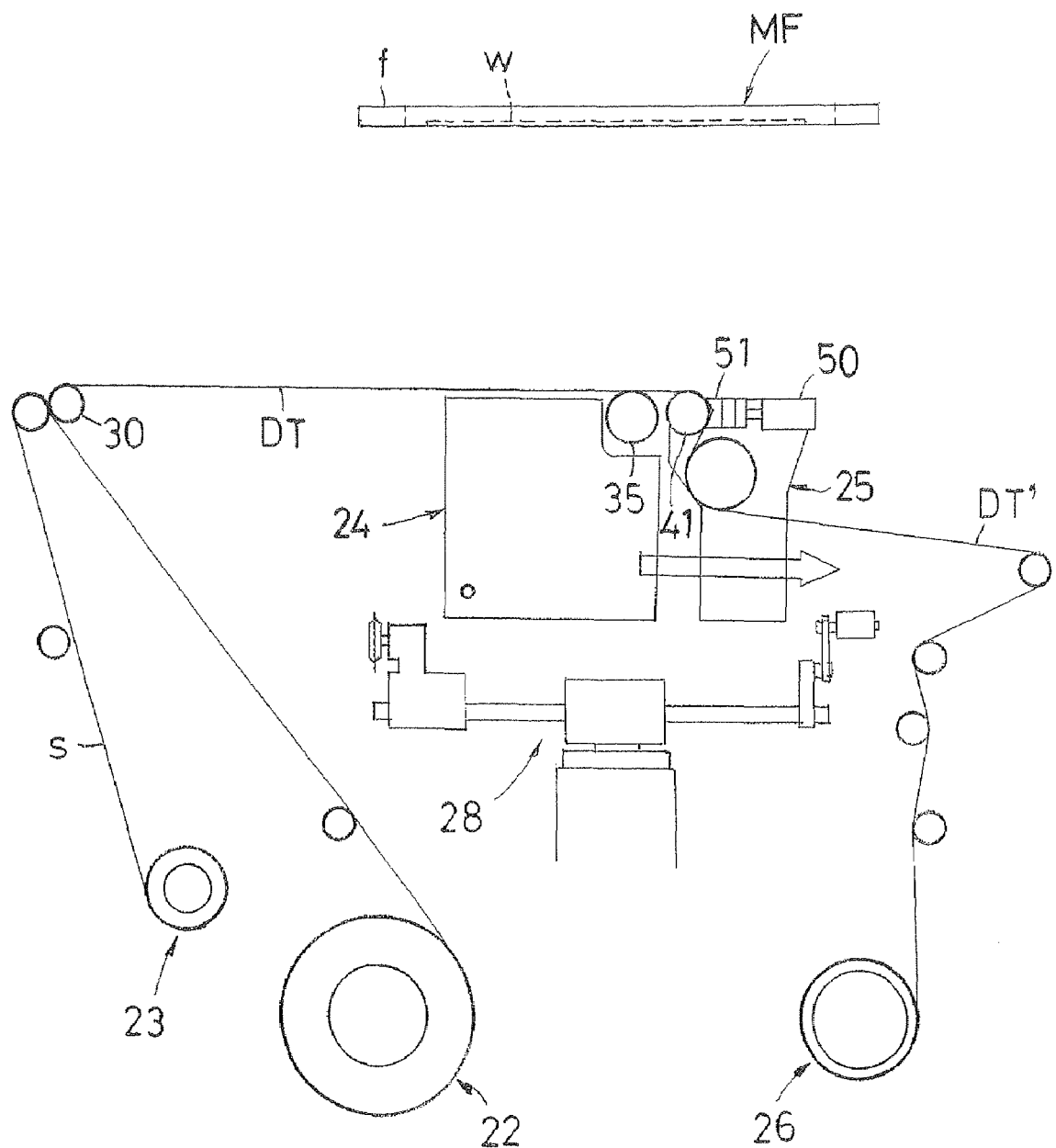

(6) After the tape cutting operation, the separating unit 25 moves forward and reaches a terminal position. As illustrated in FIG. 9, then, the workpiece holding mechanism 5 moves upward to carry a mount frame MF having a configuration that the ring frame f and the wafer w are integrated with each other through the dicing tape DT cut into the circular shape.

In the separating unit 25, moreover, a tape fixing cylinder 50 fixedly holds the residual tape DT' at a position between the separation roller 41 and a pressing piece 51. In this state, the separating unit 25 and the joining unit 24 retreat. Further, the tape take-up operation by the residual tape collecting section 26, the tape feed operation by the tape supplying section 22 and the tape take-up operation by the separator collecting section 23 are performed in synchronization with the retreat of the separating unit 25 and the joining unit 24.

(7) When the separating unit 25 and the joining unit 24 return to the standby positions, respectively, the tape fixing cylinder 50 retreats to release the residual tape DT'; thus, the adhesive tape joining apparatus 1 enters an initial state illustrated in FIG. 5. In this state, the adhesive tape joining apparatus 1 is ready for new workpieces to be carried therein. Thus, the procedure to join the dicing tape DT is completed.

With reference to FIGS. 10 to 13, next, description will be given of a step of joining the precut dicing tape dt.

(1) In a joining start state, the workpiece holding mechanism 5 is located at the upward standby position. In the workpiece holding mechanism 5, the ring frame f and the wafer w are suction-held at the predetermined positions, respectively. As illustrated in FIG. 10, in the tape joining mechanism 2, the separating unit 25, which is not used herein, is fixedly located at the standby position (rightward in the figure). On the other hand, the joining unit 24 is located on standby at an initial set position (leftward in the figure), and the tape cutting mechanism 28, which is not used herein, is fixedly located at the standby position (downward in the figure).

The carrier tape CT is fed from the tape supplying section 22, and then is supplied to the joining unit 24. Thereafter, the carrier tape CT passes a predetermined path, and then is guided to the separator collecting section 23 via the pair of pinch rollers 30. Herein, the carrier tape CT is loaded into the joining unit 24 as follows.

As illustrated in FIG. 4B, first, the joining roller 35 and the guide roller 33 are removed. A gap between the pair of pinch rollers 32 for tape reception and the pair of pinch rollers 36 for tape feed is widened, and the detection roller 37 for detection of the tape traveling amount is escaped upward; thus, the tape traveling path is released. Then, the carrier tape CT is set between the joining roller 35 and the guide roller 33, and the joining roller 35 and the guide roller 33 are attached again. Thus, the carrier tape CT is loaded. Accordingly, the predetermined tape setting state illustrated in FIG. 4A can be brought rapidly and readily.

(2) As illustrated in FIG. 10, next, the workpiece holding mechanism 5 moves downward so that the bottom surface of the ring frame f is closely opposed to the joining roller 35 and the carrier tape CT is fed by the actuation of the pair of pinch rollers 30. When the carrier tape CT travels, as illustrated in FIG. 14A, the optical sensor 39 detects the leading end of the precut dicing tape dt held by the carrier tape CT. Concurrently with this detection, the rotary encoder 38 starts to measure the moving amount of the carrier tape CT. When the moving amount reaches a predetermined moving amount set previously, the tape is stopped. In the state where the tape is stopped, as illustrated in FIG. 14B, the leading end of the precut dicing tape dt is separated from the carrier tape CT and is positioned immediately above the joining roller 35. That is, the carrier tape CT is closely opposed to the joining position of the ring frame f with the adhesion surface thereof being directed upward. A traveling distance of the tape from the start of the measurement of the moving amount to the stop of the travel of the tape is previously inputted to a controller (not illustrated).

Figure 11:
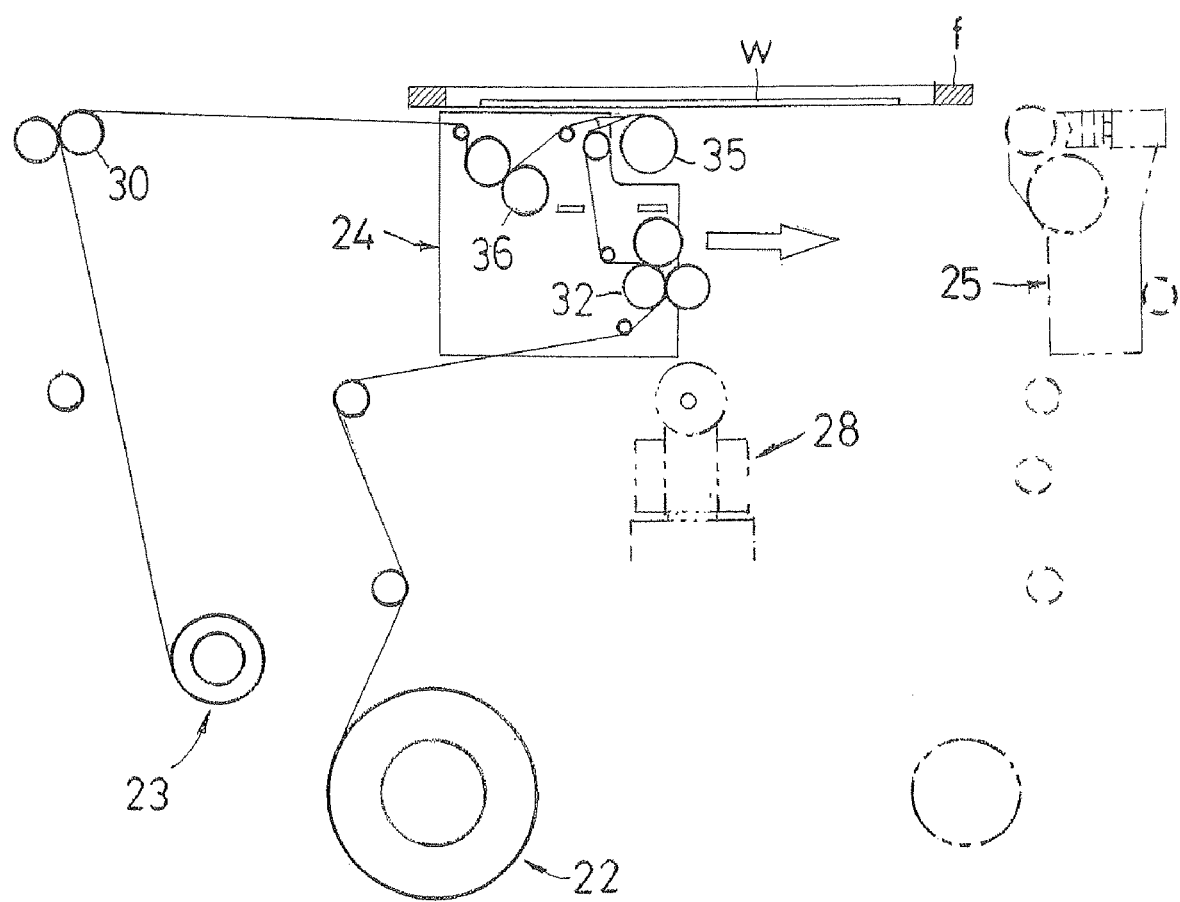

(3) As illustrated in FIG. 11, next, the joining unit 24 moves rightward until the joining roller 35 reaches the joining start position opposed to a position immediately below the end of the ring frame f. In this case, the carrier tape CT is fixedly held in such a manner that the pair of pinch rollers 32 for tape reception and the pair of pinch rollers 36 for tape feed are stopped to rotate. Thus, when the joining unit 24 moves, the carrier tape positioned above the pair of pinch rollers 32 for tape reception is pulled out from the tape supplying section 22. Concurrently, the carrier tape fed from the pair of pinch rollers 36 for tape feed is pulled out from the separator collecting section 23. Therefore, there is no change in a positional relation between the leading end of the precut dicing tape dt and the joining roller 35. Herein, when the joining unit 24 moves to the joining start position, a weak back tension is generated at the tape supplying section 22 and the separator collecting section 23, respectively.

Figure 12:
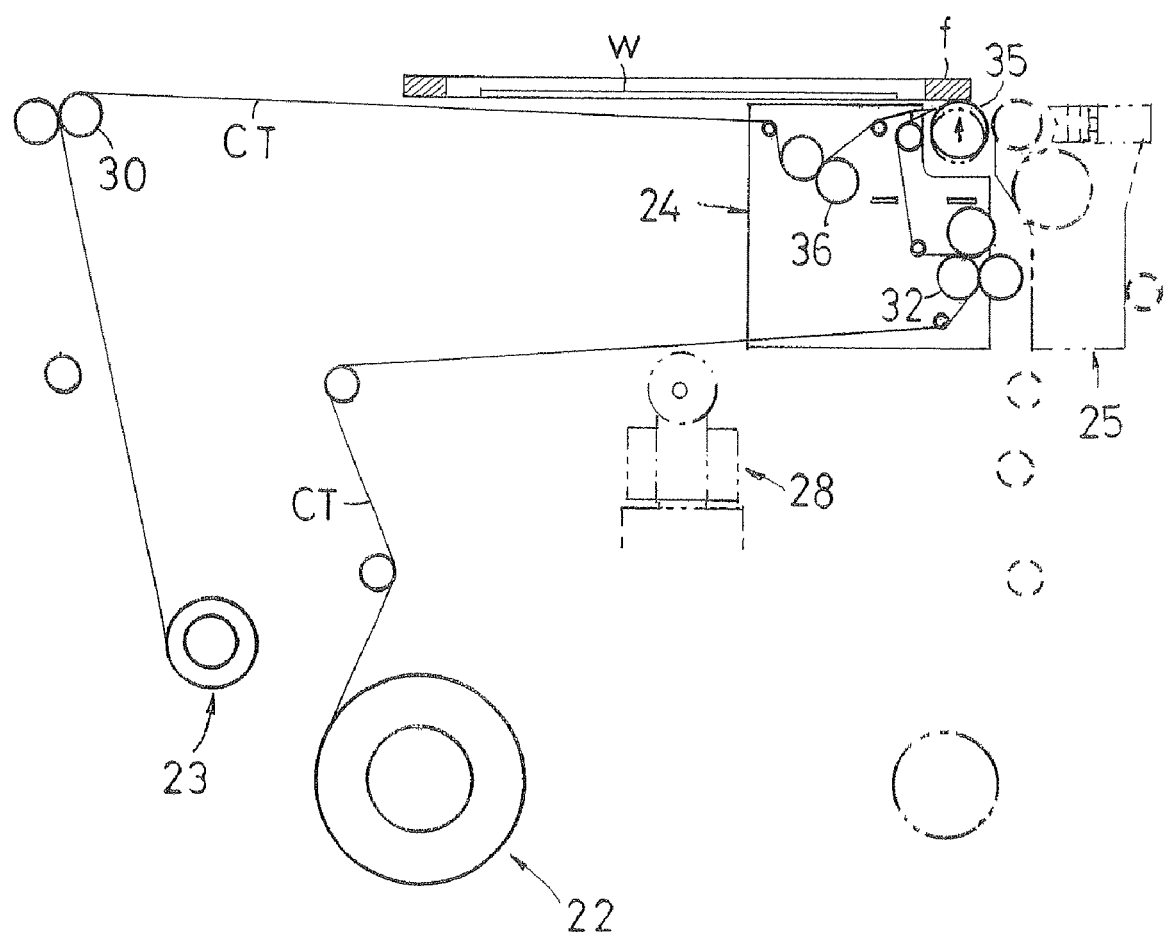
Figure 13:
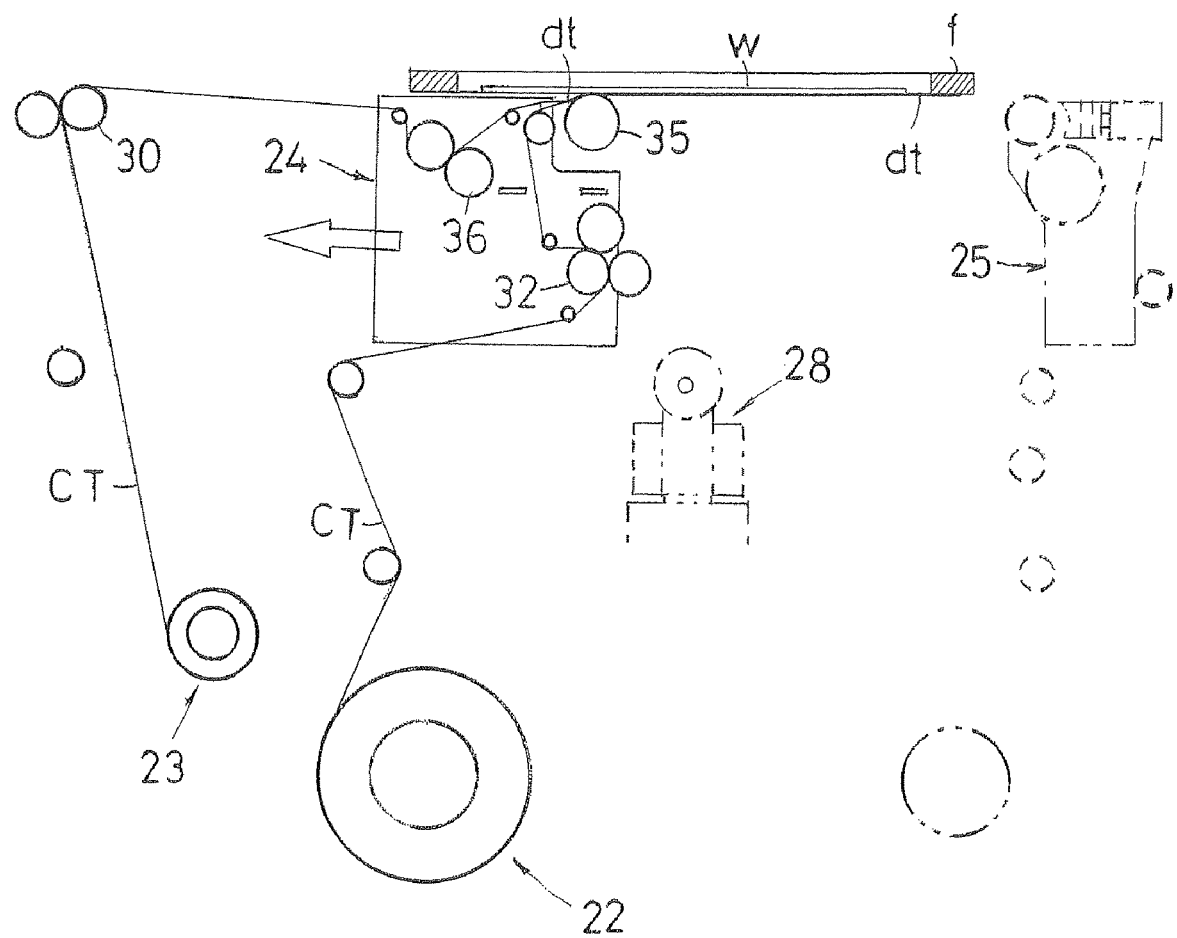

(4) As illustrated in FIG. 12, next, the joining roller 35 is pushed up at the joining start position, so that the leading end of the precut dicing tape dt is pressed against the bottom surface of the ring frame f. As illustrated in FIG. 13, thereafter, the joining unit 24 moves forward (leftward in the figure). Herein, the pair of pinch rollers 30 are actuated at a speed equal to the moving speed of the joining unit 24, so that the carrier tape CT is continuously drawn out from the tape supplying section 22. Accordingly, the precut dicing tape dt separated at the edge of the separating member 34 is continuously joined to the bottom surface of the ring frame f and the bottom surface of the wafer w by the joining roller 35. Herein, when the joining unit 24 moves to join the tape, a weak back tension is generated at the tape supplying section 22 and the separator collecting section 23, respectively.

(5) When the joining unit 24 moves forward to reach the terminal position, the workpiece holding mechanism 5 moves upward to carry a mount frame MF having a configuration that the ring frame f and the wafer w are integrated with each other through the precut dicing tape dt. Further, the adhesive tape joining apparatus 1 is ready for new workpieces to be carried therein. Thus, the procedure to join the precut dicing tape dt is completed.

According to the adhesive tape joining apparatus 1 described above, either the strip-shaped dicing tape or the precut dicing tape can be joined to the ring frame f and the wafer w irrespective of the shape of the dicing tape. Accordingly, apparatuses for the respective shapes of the tapes need not to be provided, leading to reduction in installation costs and an installation space.

The present invention may be modified as follows.

Figure 15:
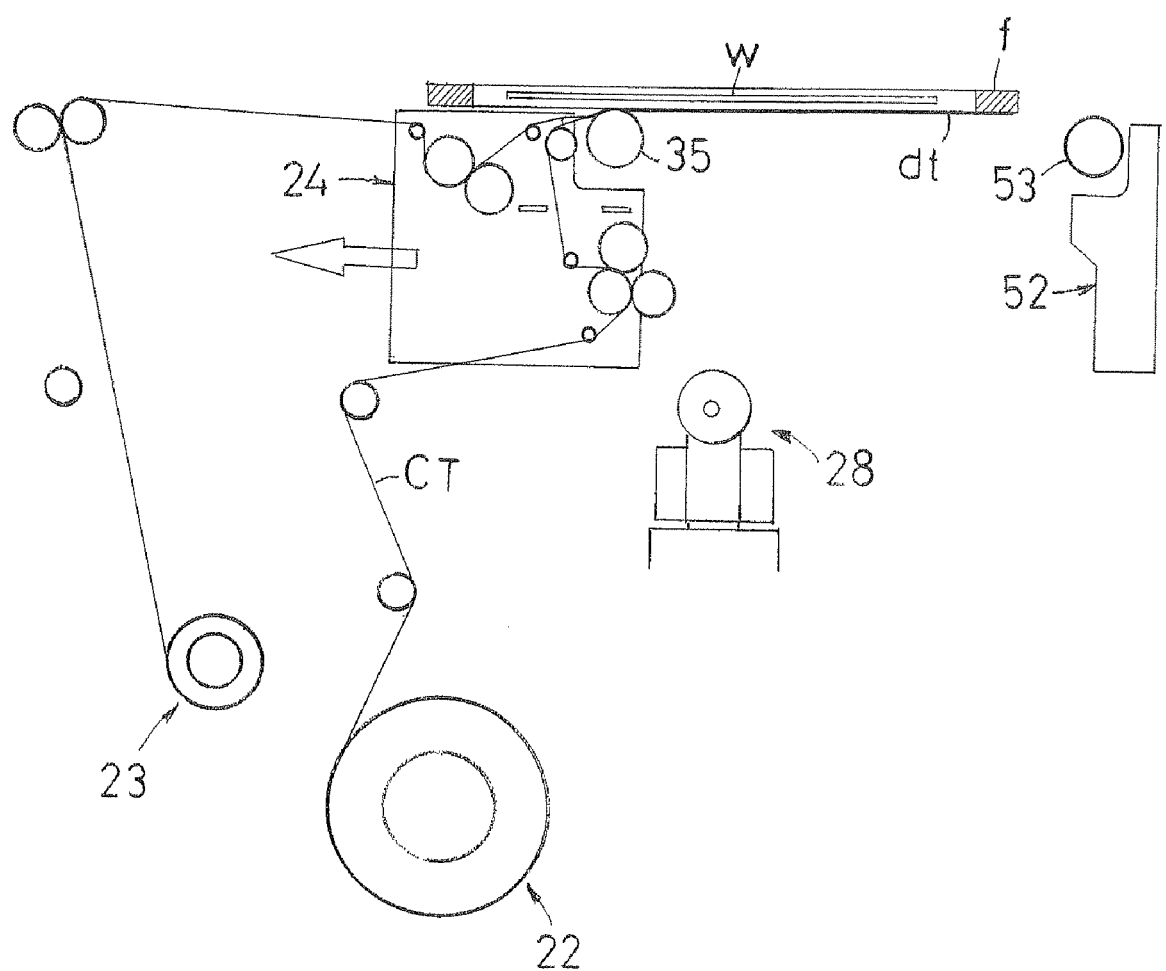
FIG. 15 illustrates a step of joining a precut dicing tape according to another embodiment.
Figure 16:
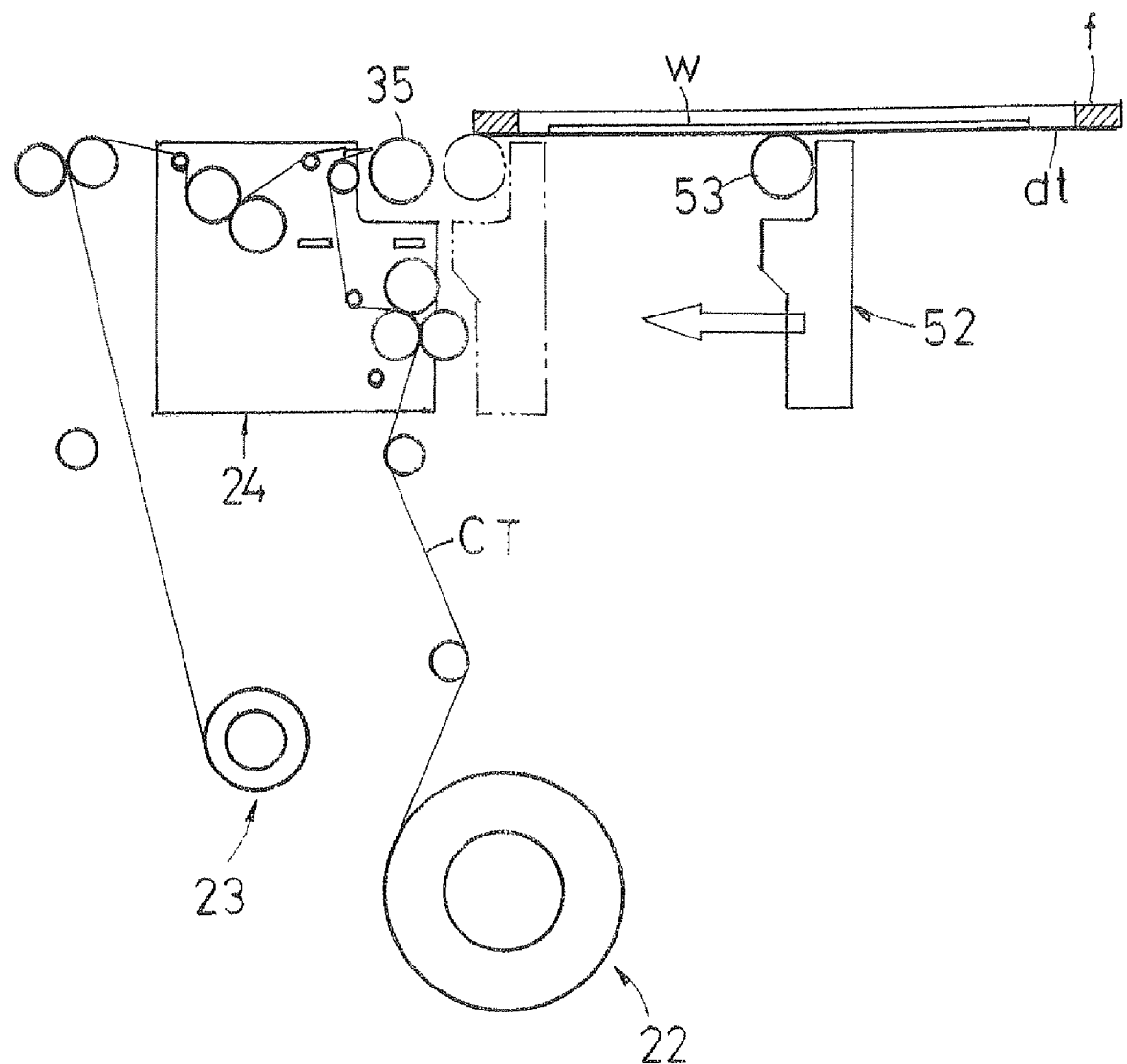
FIG. 16 illustrates a step of joining a precut dicing tape according to still another embodiment.

(1) As illustrated in FIG. 15, in the case where the precut dicing tape dt is used, the wafer w is placed at a position higher in height than the joining position in the state where the ring frame f moves downward to the joining position. In this state, the joining unit 24 moves to join the precut dicing tape dt to only the bottom surface of the ring frame f. As illustrated in FIG. 16, thereafter, the wafer w moves downward so as to be flush with the bottom surface of the ring frame f or so as to slightly protrude from the bottom surface of the ring frame f. Then, a second joining unit 52 provided additionally moves. That is, the precut dicing tape dt joined to the bottom surface of the ring frame f can be joined to the bottom surface of the wafer w by a second joining roller 53. As described above, the tape joining operation for the ring frame f and the tape joining operation for the wafer w are performed separately, so that the ring frame f and the wafer w can be joined to the tape with certainty.

Also in the case of using the strip-shaped dicing tape DT, the tape joining operations can be performed as in the case of using the precut dicing tape dt. That is, the dicing tape DT is joined to only the bottom surface of the ring frame f, and then is joined to the wafer w in such a manner that the wafer w moves downward to the joining action position. With this configuration, even when the strip-shaped dicing tape DT flaps due to disturbance such as wind, the dicing tape DT positioned ahead the joining roller 35 can not be joined to the back side of the wafer w. This improves adhesive tape joining accuracy.

(2) In the foregoing embodiment, the workpiece holding mechanism 5 is provided above the tape joining mechanism 2 in order to join the tape to the bottom surface of the workpiece. Alternatively, the tape may be joined as follows.

For example, the workpiece holding mechanism 5 that holds the workpiece such that the tape joining side is directed upward is provided below the tape joining mechanism 2 so as to move upward/downward.

(3) In the foregoing embodiment, a roll of the dicing tape DT or a roll of the carrier tape CT is loaded into the tape supplying section 22 by means of the common feed shaft 29. Alternatively, the tape may be loaded as follows.

A feed shaft for only the dicing tape DT and a feed shaft for only the carrier tape CT are provided in the tape supplying section 22, so that the dicing tape DT and the carrier tape CT can be loaded into the tape supplying section 22 independently. In the foregoing embodiment, further, the separator collecting section 23 takes up and collects the separator s and the carrier tape CT by means of the common take-up shaft 31. Alternatively, two take-up shafts are provided in the separator collecting section 23, so that the separator s and the carrier tape CT can be taken up and collected by means of the dedicated two take-up shafts.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for joining an adhesive tape for support to a bottom surface of a ring frame and a bottom surface of a semiconductor wafer mounted or a center of the ring frame to integrate the semiconductor wafer with the ring frame, the apparatus comprising:

a workpiece holding mechanism that holds each of a ring frame and a semiconductor wafer in a predetermined position;

a tape supplying device that switches between loading of a strip-shaped adhesive tape and loading of a strip-shaped carrier tape by which a precut adhesive tape cut previously in correspondence with a size of the ring frame is held, and supplies the adhesive tape loaded thereinto toward a bottom surface of the ring frame held by the workpiece holding mechanism;

a tension mechanism that applies a tension to the supplied strip-shaped adhesive tape in a width direction;

a joining unit that includes a joining roller for rolling on a non-adhesion surface of the strip-shaped adhesive tape with the tension being applied thereto by the tension mechanism and a non-adhesion surface of the precut adhesive tape separated from the carrier tape folded back by a separating member while pressing these non-adhesion surfaces, and joins the adhesive tape to the ring frame and the semiconductor wafer each held by the workpiece holding mechanism;

a tape cutting mechanism that cuts the joined strip-shaped adhesive tape along a contour of the ring frame; and a residual tape collecting section that takes up and collects a residual tape of the cut strip-shaped adhesive tape.

2. The apparatus according to claim 1, wherein the workpiece holding mechanism includes a frame holding device that holds the ring frame, a wafer holding device that holds the semiconductor wafer, and a movable base that allows the frame holding device and the wafer holding device to move upward/downward.

3. The apparatus according to claim 2, further comprising:

a driving device that allows the wafer holding device to move upward/downward such that the semiconductor wafer held by the wafer holding device moves upward/downward independently of the ring frame held by the frame holding device.

4. The apparatus according to claim 3, further comprising:

an elastic member that elastically supports the semiconductor wafer at a position between the wafer holding device and the semiconductor wafer so as to retreat toward the wafer holding device holding the semiconductor wafer.

5. The apparatus according to claim 4, further comprising:

a control device that controls the driving device such that the semiconductor wafer held by the workpiece holding device is stopped at a position where the semiconductor wafer protrudes from the adhesive tape joining surface of the ring frame.

6. The apparatus according to claim 5, wherein the pressing operation by the joining roller is controlled upon joining of the adhesive tape such that the adhesive tape joining surface of the semiconductor wafer is flush with the adhesive tape joining surface of the ring frame.

7. The apparatus according to claim 4, further comprising:

a control device that controls the driving device such that the semiconductor wafer held by the workpiece holding device is located on standby at a position rearward with respect to the adhesive tape joining surface of the ring frame, the adhesive tape is joined to the ring frame by a joining roller, the semiconductor wafer is moved to the adhesive tape joining position and the adhesive tape is joined to the semiconductor wafer by a joining roller.

8. The apparatus according to claim 7, wherein
the joining roller for joining the adhesive tape to the ring frame is provided in a first joining unit, and the joining roller for joining the adhesive tape to the semiconductor wafer is provided in a second joining unit.

9. The apparatus according to claim 1, wherein
the strip-shaped adhesive tape is provided with a separator, the apparatus further comprising:

a common separator collecting section that takes up and collects one of the separator separated from the strip-shaped adhesive tape and the carrier tape from which the precut adhesive tape is separated.

10. The apparatus according to claim 1, further comprising:

a common tape supplying section that feeds and supplies a tape from one of a roll of an adhesive tape with a separator and a roll of a carrier tape by which a precut adhesive tape is held.

\* \* \* \* \*